US011635394B2

(12) United States Patent
Ma et al.

(10) Patent No.: US 11,635,394 B2
(45) Date of Patent: Apr. 25, 2023

(54) SENSING USING INVERSE MULTIPLE SCATTERING WITH PHASELESS MEASUREMENTS

(71) Applicant: Mitsubishi Electric Research Laboratories, Inc., Cambridge, MA (US)

(72) Inventors: Yanting Ma, Allston, MA (US); Muhammad Asad Lodhi, Edison, NJ (US); Hassan Mansour, Boston, MA (US); Petros Boufounos, Winchester, MA (US); Dehong Liu, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 541 days.

(21) Appl. No.: 16/786,107

(22) Filed: Feb. 10, 2020

(65) Prior Publication Data

US 2021/0247333 A1    Aug. 12, 2021

(51) Int. Cl.
    *G01N 23/20*    (2018.01)
    *G01M 5/00*    (2006.01)
    (Continued)

(52) U.S. Cl.
CPC ......... *G01N 23/20* (2013.01); *G01M 5/0025* (2013.01); *G01N 22/00* (2013.01); *G01S 13/887* (2013.01);
(Continued)

(58) Field of Classification Search
None
See application file for complete search history.

(56) References Cited

U.S. PATENT DOCUMENTS 4,662,222 A * 5/1987 Johnson ................ G01S 15/895
    73/602
5,588,032 A * 12/1996 Johnson .................. G01S 13/89
    378/90
(Continued)

OTHER PUBLICATIONS

V. A. Mikhnev and P. Vainikainen, "Two-step inverse scattering method for one-dimensional permittivity profiles," in IEEE Transactions on Antennas and Propagation, vol. 48, No. 2, pp. 293-298, Feb. 2000, doi: 10.1109/8.833079. (Year: 2000).*

(Continued)

*Primary Examiner* — Bernarr E Gregory
(74) *Attorney, Agent, or Firm* — Gennadiy Vinokur; Hironori Tsukamoto

(57) ABSTRACT

A permittivity sensor, for determining an image of a distribution of permittivity of a material of an object in a scene, comprising an input interface, a hardware processor, and an output interface is provided. The input interface is configured to accept phaseless measurements of propagation of a known incident field through the scene and scattered by the material of the object in the scene. The hardware processor is configured to solve a multi-variable minimization problem over unknown phases of the phaseless measurements and unknown image of the permittivity of the material of the object by minimizing a difference of a nonlinear function of the known incident field and the unknown image with a product of known magnitudes of the phaseless measurements and the unknown phases. Further, the output interface is configured to render the permittivity of the material of the object provided by the solution of the multi-variable minimization problem.

13 Claims, 11 Drawing Sheets

(51) Int. Cl.
*G01N 22/00* (2006.01)
*G01S 13/88* (2006.01)
*G01S 13/89* (2006.01)
*G01V 8/00* (2006.01)
*G01V 9/00* (2006.01)
*G01S 13/00* (2006.01)

(52) U.S. Cl.
CPC ............... *G01S 13/89* (2013.01); *G01V 8/00* (2013.01); *G01V 9/00* (2013.01); *G01N 2223/101* (2013.01); *G01N 2223/405* (2013.01)

(56) References Cited

U.S. PATENT DOCUMENTS

| | | | | |
|---|---|---|---|---|
| 9,329,263 | B2 * | 5/2016 | Haynes | G01S 13/89 |
| 9,519,054 | B2 * | 12/2016 | Kim | G01S 13/88 |
| 10,768,214 | B2 * | 9/2020 | Safavi-Naeini | G01N 22/00 |
| 10,976,461 | B2 * | 4/2021 | Arumugam | G01S 13/885 |

OTHER PUBLICATIONS

J. Fessler. Apr. 17, 2019,18:24 (class version). Chapter 6. Alternating minimization. Alternating minimization fessler/course/598.

Pham et al. Versatile reconstruction framework for diffraction tomography with intensity measurements and multiple scattering. Optics express 2749, Research Article. vol. 26, No. 3. Feb. 5, 2019.

* cited by examiner

SENSING USING INVERSE MULTIPLE SCATTERING WITH PHASELESS MEASUREMENTS

TECHNICAL FIELD

This invention relates to sensing systems and methods, and more specifically to system and method for determining an image of a distribution of permittivity of a material from phaseless (intensity-only) measurements of its scattered electromagnetic field.

BACKGROUND

The composition or internal structure of an object can be visualized by numerically generating an image that represents distribution of permittivity of the materials in the object. A transmitter emits a signal in some modality, such as an electromagnetic (EM), light or ultrasonic wave or pulse, which propagates through the object, reflects off various structures inside the object, and propagates to a receiver sensor array. In particular, the non-uniform distribution of the permittivity inside the object, due to changes in its material composition and structure, forces the wave or the pulse to deviate from a straight-line trajectory and scatter in different paths. Part of the scattered signal is measured by sensors placed inside or around the object. Inverse scattering is the problem of reconstructing the permittivity distribution inside the object from the measured scattered wave or pulse. The composition of the object can also be visualized by numerically generating an image that represents this distribution of the permittivity of the materials in the object.

Depending on the material composition of the object, the received signal often results from the multiple reflections of the propagating pulse due to multiple scattering from the structures in the object, which results in artifacts that clutter the reconstructed image. Most of the conventional methods addressing this problem have considered linear forward models that enable an efficient convex formulation of inverse problem by neglecting the multiple scattering. However, these linear models tend to be highly inaccurate in high contrast settings, i.e., when the permittivity changes significantly between different structures in the object and the background. This effect is especially prominent in situations where the size of the structure is large with respect to the wavelength of the incident wave.

To address this deficiency, some methods use nonlinear formulation of image acquisitions that provide a more accurate representation of the physical setup by modeling multiple scattering and facilitate imaging in high contrast settings. These nonlinear inverse problems are usually more challenging to solve than solving their linear counterparts. Still, several methods have been recently developed to directly invert the nonlinear forward model, hence enabling imaging in high permittivity contrast settings, provided that both the magnitude and the phase of the scattered wave are available.

However, in a number of applications, measuring phase of the scattered wave can be impractical or expensive. In others, the phase measurements can be very noisy or unreliable. In these applications, the problem becomes one of phaseless image recovery, i.e., recovery from measurements lacking phase information of the measured scattered wave.

The common method for solving a phaseless image recovery problem is alternating minimization, i.e., methods that alternate between phase estimation (using phase retrieval techniques) and the inversion problem (based on the estimated phase). However, the alternating minimization is sensitive to the choice of optimization parameters. Some other methods, not based on alternating minimization, are less effective for practical imaging problems. Some methods exploit a good initialization or initial guess to determine a solution. However, it is difficult to provide the initial good initialization of the phaseless image recovery problem. Other methods lift the phaseless image recovery problem into a different domain (i.e. a higher dimensional domain) to solve the problem in that domain. However, solving the problem in a lifted higher dimensional space can be computationally prohibitive and can make incorporating image priors impractical.

Accordingly, there is a need for a method for reconstructing an object from phaseless measurements in the context of inverse multiple scattering.

SUMMARY

Some embodiments are based on recognition of the cause of the difficulties in solving phaseless image recovery problem. In solving this problem, the permittivity distribution of the materials in the measured object is the unknown image to be reconstructed. In the presence of phase information, a typical image reconstruction approach attempts to explain the acquired data as a function of the image being measured. This function is formulated based on the physical principles of wave propagation appropriate for the domain and modality of the application and is referred to as the forward model. Accordingly, the image reconstruction methods determine the unknown image of a scene that explains the measured data through this forward model. Naturally, when the measured data lack phase, the phaseless image reconstruction methods tend to adapt existing formulations of image recovery problem by inserting an unknown phase to correct the function of the image, such that the existing formulations can be reused. This approach, however, results in a multiplicative coupling between the unknown phase and the unknown image.

Some embodiments are based on realization that the multiplicative coupling between the unknown phase and the unknown image exacerbate non-convexity of image recovery problem, especially in the presence of nonlinearities due to multiple scattering and high contrast ratios. For this reason, there is a tendency to use alternating minimization, which is very sensitive to the choice of initialization and is prone to converge to undesirable local minima, which do not provide high quality reconstruction. In the case of linear forward models, it is possible to lift the image reconstruction problem to a higher dimensional space, making the resulting problem convex and eliminating phase as an unknown. However, this results in a prohibitively large optimization problem. Furthermore, in the nonlinear case of multiple scattering, the problem is still non-convex.

Accordingly, it is an object of some embodiments to decouple variables that represent the unknown image and the unknown phase in the forward model capturing image acquisition. Such a decoupling can enable the embodiments to solve the reconstruction problem over both unknowns simultaneously, e.g., with appropriate regularization for each.

Specifically, some embodiments are based on realization that the unknown phase can be incorporated in the image reconstruction problem by multiplying and correcting known phaseless measurements, such that the measurements incorporating phase can be explained by the image through the forward model. To that end, the phaseless measurements are obtained by a measurement system, where the measurement system can be modelled as obtained by acquiring a magnitude value (i.e. the known phaseless measurement) of a complex non-linear measurement of the unknown image. Using this realization, the unknown phase is used to multiplicatively correct known parameters, i.e., the phaseless measurements. This is in contrast to previous formulations that attempt to recover a phase that multiplicatively modifies the forward model to explain the phaseless measurement. Thus, in the previous formulation, the unknown phase multiplies a function of the unknown image, i.e., there is multiplicative coupling of the unknowns. In contrast, the formulation of the embodiments decouples the unknown phase from the unknown image by coupling the unknown phase with known measurements.

However, the resulting problem is still nonlinear and non-convex because of the nonlinearity of the forward model under multiple scattering. This nonlinearity is due to the interdependence of the unknown image and a total field created by the propagation of the wave through the object and the interaction of the wave with the material structure of the object.

Some embodiments are based on another realization that the nonlinearity of the image acquisition can be modelled by representing the total field of wave propagation using the known incident field generated by the transmitters and the scattered field, scattered by the object in the unknown image. This realization allows representing a product of the phaseless measurements with the unknown phase as a nonlinear function of known incident field and unknown image of the object.

Such a formulation is still nonlinear and non-convex. However, the nature of this formulation leads to a better-behaved non-convex objective function (a function of the unknown image and the unknown phase) due to decoupling the multiplicative relationship between the unknown image and the unknown phase, and, therefore, allows for various non-convex and even convex solvers to obtain high quality reconstructed images. For example, some embodiments solve the phaseless image recovery problem by minimizing an objective function that includes a sum of a data fidelity term and a regularization term, where the data fidelity term is the difference between a nonlinear function of the known incident field and the unknown image of the scene and a product of the phaseless measurements with the unknown phase, and the regularization term includes a sum of a total variation penalty of the unknown image and a magnitude constraint of the unknown phase, for example that a valid phase variable has magnitude equal to one. In various implementations, the embodiments use convex and/or non-convex solvers to minimize the objective function using alternating minimization methods or simultaneous multi-variable minimization methods that solve the optimization over both unknowns simultaneously by updating both unknowns for each iteration. Examples of simultaneous multi-variable minimization methods include proximal gradient methods such as fast iterative shrinkage-thresholding algorithm (FISTA) and its variates. In particular, some embodiments use FISTA to minimize the aforementioned objective function and call the resulting algorithm phaseless iterative shrinkage-thresholding algorithm (PISTA). In some situations, the simultaneous multi-variable minimization methods show superior results over the alternating minimization methods.

In some embodiments, the measurement system is implemented in a civil infrastructure system that solves the phaseless image recovery problem by using the convex and/or non-convex solvers in order to detect at least one of defects of a material of an object, cavities, non-visible objects of a civil infrastructure (e.g., underground objects, pipe leaks or cavities under a road, or defects inside a bridge structure), any three-dimensional object in a three-dimensional space. In some implementations, the civil infrastructure system is a moving platform that moves within the civil infrastructure to detect at least one of defects of the material of the object, the cavities or the non-visible objects of the civil infrastructure. For example, the system might include a vehicle driving around, surveying the infrastructure.

Accordingly, one embodiment discloses a permittivity sensor for determining an image of a distribution of permittivity of a material of an object in a scene. The permittivity sensor includes an input interface configured to accept phaseless measurements of propagation of a known incident field through the scene and scattered by the material of the object in the scene; a hardware processor configured to solve a multi-variable minimization problem over unknown phases of the phaseless measurements and unknown image of the permittivity of the material of the object by minimizing a difference of a nonlinear function of the known incident field and the unknown image with a product of known magnitudes of the phaseless measurements and the unknown phases; and an output interface configured to render the permittivity of the material of the object provided by the solution of the multi-variable minimization problem.

Some implementations also use regularization terms of the unknown image and the unknown phase to improve the convergence.

Another embodiment discloses a method for determining an image of a distribution of permittivity of a material of an object in a scene, comprising accepting phaseless measurements of propagation of a known incident field through the scene and scattered by the material of the object in the scene; solving a multi-variable minimization problem over unknown phases of the phaseless measurements and unknown image of the permittivity of the material of the object by minimizing a difference of a nonlinear function of the known incident field and the unknown image with a product of known magnitudes of the phaseless measurements and the unknown phases; and rendering the permittivity of the material of the object provided by the solution of the multi-variable minimization problem.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

DETAILED DESCRIPTION

In the following description, for purposes of explanation, numerous specific details are set forth in order to provide a thorough understanding of the present disclosure. It will be apparent, however, to one skilled in the art that the present disclosure may be practiced without these specific details. In other instances, apparatuses and methods are shown in block diagram form only in order to avoid obscuring the present disclosure.

As used in this specification and claims, the terms "for example," "for instance," and "such as," and the verbs "comprising," "having," "including," and their other verb forms, when used in conjunction with a listing of one or more components or other items, are each to be construed as open ended, meaning that that the listing is not to be considered as excluding other, additional components or items. The term "based on" means at least partially based on. Further, it is to be understood that the phraseology and terminology employed herein are for the purpose of the description and should not be regarded as limiting. Any heading utilized within this description is for convenience only and has no legal or limiting effect.

Solution Overview

Figure 1:
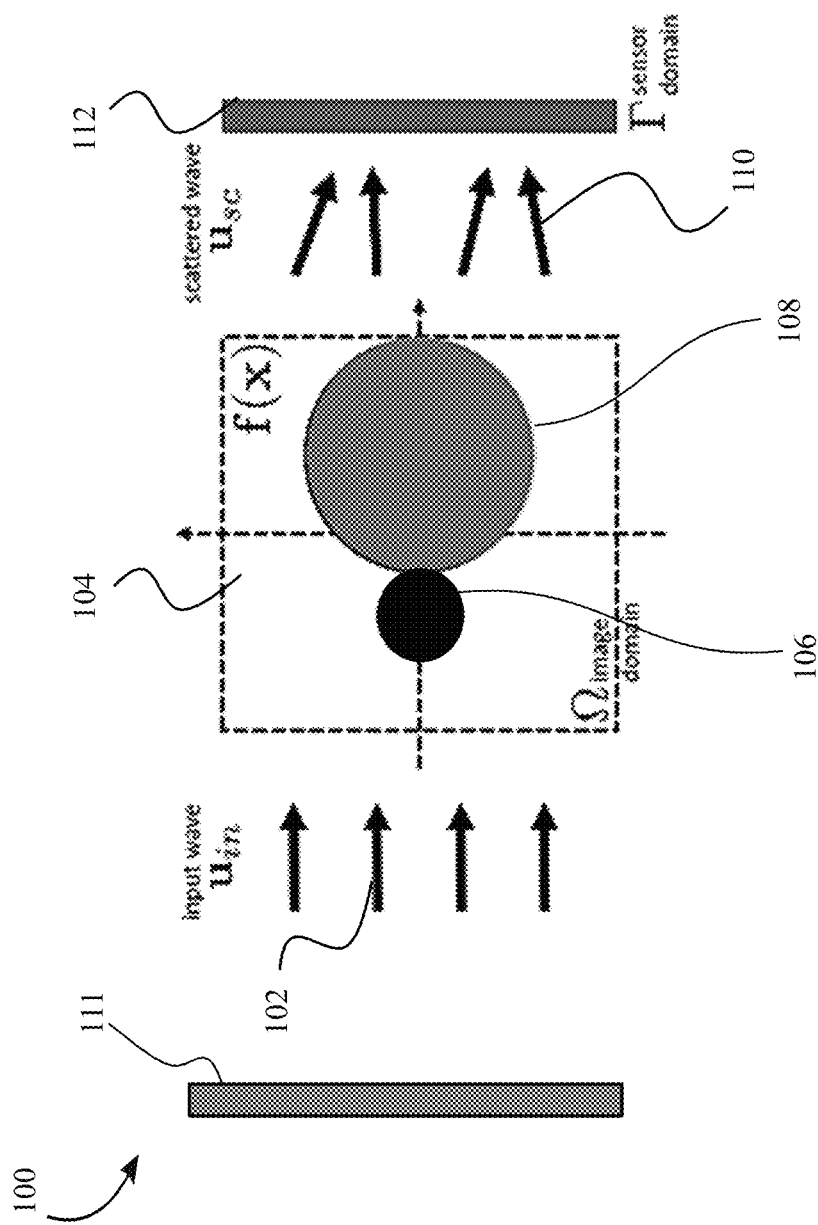
FIG. 1 shows a schematic of a setup for inverse scattering, according to some embodiments.

FIG. 1 shows a schematic of a setup 100 for inverse scattering image reconstruction according to some embodiments. In FIG. 1, there is shown an object 106, 108 in a scene (i.e. a bounded domain Ω 104) and sensors 112 positioned outside the bounded domain Ω 104. The object 106, 108, collectively, may correspond to a two- or three-dimensional single entity having multiple sub-parts (e.g., a first part 106 and a second part 108). Alternatively, the object 106, 108 may correspond to a single part as a complete entity. There is further shown an input wave 102 incident on the object 106,108 and is further scattered (as a scattered wave 110) from the object 106,108. There is further shown that the scattered wave 110 is received by the sensor 112. The wave 102 is emitted by a transmitter 111. In this exemplar embodiment, the transmitters 111 and the sensors 112 are located on opposite sides of the objects 106, 108. In alternative implementations, the transmitters 111 and the sensor 112 are located on the same side of the objects 106, 108. In some embodiments the transmitters 111 and the sensors 112 might use the same physical device, operating in transmitting or receiving mode.

The inverse scattering image reconstruction according to some embodiments estimates spatial permittivity profile ε(x) in the bounded domain Ω 104, where $x \in \mathbb{R}^2$ represents spatial coordinates in the bounded domain Ω 104. For example, one or more transmitters 111 transmit the incident wave 102 in some modality, such as an electromagnetic (EM), light or ultrasonic wave or pulse, which propagates through the object 106,108 and illuminate the object 106, 108. The input wave 102 incident on the object 106, 108 represents input field $u_{in}$ that is typically known and determined by the system design and the laws of wave propagation. The object 106,108 scatters the incident wave 102 inside and outside the domain Ω 104 and, consequently, a scattered field due to the scattered wave 110 is established and can be measured. In particular, the non-uniform distribution of permittivity inside the object 106,108 due to changes in its material composition and structure, forces the incident wave 102 to deviate from a straight-line trajectory and scatter in different paths. The scattered field is measured by the sensors 112, as $u_{sc}$. The measured the scattered field $u_{sc}$ from a single or a plurality of sensors, known as array of sensors, is used to reconstruct the image of the object 106,108.

The reconstruction of the image of the object 106,108 from the scattered field $u_{sc}$ is called as inverse scattering. Therefore, a system including such a sensor (i.e. the sensor 112 or the array of sensors) may also be called as a measurement and/or a sensing system.

In such a manner, a total field u in the imaging setup 100 is the sum of the two fields (i.e. input field $u_{in}$ and the scattered field $u_{sc}$) such that $$u = u_{in} + u_{sc}.$$

Further, relationship among the total field u, the input field $u_{in}$, and the scattering object 106,108 through the scalar Lippmann-Schwinger relationship can be expressed by an equation as given below:

$$u(x) = u_{in}(x) + \int_\Omega g(x-x') u(x') f(x') dx', \forall x \in \mathbb{R}^2,$$

where, $f(x) = k^2 (\varepsilon(x) - \varepsilon_b)$ represents the scattering potential, $\varepsilon_b$ represents the permittivity of the background, $k = \pi/\lambda$ is wavenumber in vacuum, and $g(x) = j/4 H_0^{(1)}(k_b \|x\|)$ is the free-space Green's function in 2D, with $H_0^{(1)}$ representing the zero-order Hankel function of the first kind, $k_b = k\sqrt{\varepsilon_b}$ representing the background wavenumber, and $\|\cdot\|$ representing the Euclidean norm.

Further, a discretized system for the imaging setup 100 is formulated as:

$$\hat{y} = H \, \text{diag}(u) f$$

$$u = u_{in} + G \, \text{diag}(f) u, \quad (1)$$

where $f \in \mathbb{R}^N$, $u \in \mathbb{C}^N$, and $u_{in} \in \mathbb{C}^N$ are samples of f(x), u(x) and $u_{in}(x)$, respectively, obtained at N points in the domain Ω 104. The diag(f) represents a diagonal matrix with f on its main diagonal, and $\hat{y} \in \mathbb{C}^M$ represents the scattered wave observed in the sensor domain Γ. In some embodiments, the N points in the domain are selected to be on a regular grid, with appropriately fine discretization. In different embodiments, the discretization accuracy is a design parameter and/or guided by a wavelength of the transmitted pulse, to ensure that objects or features of the objects are taken into account if they are sufficiently large to interact with the incident or the scattered wave.

Further, the matrix $H \in \mathbb{C}^{M \times N}$ in formulation (1) corresponds to a mapping from an image domain to sensor domain Γ, as defined by discretizing the continuous Green's function g(x−x') for x∈Γ and x'∈Ω. Similarly, the matrix $G \in \mathbb{C}^{N \times N}$ is the mapping within the image domain, as defined by discretizing the Green's function $g(x-x')$ for $x, x' \in \Omega$.

Some embodiments are based on recognition that, in a number of applications, measuring phase of the scattered wave can be impractical or expensive. In others, the phase measurements can be very noisy or unreliable. In these applications, the problem becomes one of phaseless image recovery, i.e., recovery from measurements lacking phase information of the measured scattered wave. For example, the phaseless image recovery problem is applicable to optical sensing, such as Fourier ptychographic microscopy and optical diffraction tomography, due to the difficulties of nonlinear coherent measurements. The phaseless image recovery problem is also applicable in a motion related applications due to nonlinearity of distortion caused by the motion and in terahertz (THz) sensing due to difficulties of phase measurements with sufficient resolution.

To that end, in some embodiments, the measurement system is phaseless, i.e., only the magnitude of the scattered wave $u_{sc}$ is recorded. Accordingly, the acquired data (in the absence of noise) may be expressed using the formulation (1) as:

$$y = |H \, \text{diag}(u) f|$$

$$u = u_{in} + G \, \text{diag}(f) u_{sc} \quad (2)$$

The formulation (2) corresponds to nonlinear and phaseless image reconstruction, where $y \in \mathbb{R}_{+0}^M$ represents the magnitude of the scattered wave $\hat{y}$ observed in the sensor domain $\Gamma$.

Some embodiments are based on recognition that the image reconstruction methods determine the unknown image of a scene that explains the measured data through this forward model. Naturally, when the measured data lack phase, the phaseless image reconstruction methods tend to adapt existing formulations of image recovery problem by inserting an unknown phase to correct the function of the image, such that the existing formulations can be reused. This approach, however, results in a multiplicative coupling between the unknown phase and the unknown image. That multiplicative coupling between the unknown phase and the unknown image exacerbate non-convexity of image recovery problem, especially in the presence of nonlinearities due to multiple scattering and high contrast ratios.

Accordingly, it is an object of some embodiments to decouple variables that represent the unknown image and the unknown phase in the forward model capturing image acquisition. Such a decoupling can enable the embodiments to solve the reconstruction problem over both unknowns simultaneously, with appropriate regularization for each.

Specifically, some embodiments are based on realization that the unknown phase can be incorporated in the image reconstruction problem by multiplying and correcting known phaseless measurements, such that the measurements incorporating phase can be explained by the image through the forward model. To that end, the phaseless measurements are obtained by a measurement system, where the measurement system can be modelled as obtained by acquiring a magnitude value (i.e. the known phaseless measurement) of a complex non-linear measurement of the unknown image. Using this realization, the unknown phase is used to multiplicatively correct known parameters, i.e., the phaseless measurements. This is in contrast to previous formulations that attempt to recover a phase that multiplicatively modifies the forward model to explain the phaseless measurement. Thus, in the previous formulation, the unknown phase multiplies a function of the unknown image, i.e., there is multiplicative coupling of the unknowns. In contrast, the formulation of the embodiments decouples the unknown phase from the unknown image by coupling the unknown phase with known measurements.

For example, the unknown phase of the scattered wave 110 is modeled through a complex phase-only vector $p \in \mathbb{C}^M$, i.e., $\hat{y} = y \odot p$, where $\odot$ denotes element-wise product. Thus, phaseless observations satisfy $y \odot p = H \, \text{diag}(f) u$. In presence of noise, the formulation (2) can be expressed as:

$$\text{diag}(y) p = H \, \text{diag}(u) f + e$$

$$u = u_{in} G \, \text{diag}(f) u \quad (3)$$

where $e \in \mathbb{C}^M$ represents the noise.

Some embodiments are based on an objective of estimating an unknown object f and an unknown phase p by the phaseless observations and the incident field $u_{in}$, under the constraints that f is a piecewise constant and the unknown phase p is a phase-only vector.

However, the resulting problem is still nonlinear and non-convex because of the nonlinearity of the forward model under multiple scattering. This nonlinearity is due to the interdependence of the unknown image and a total field created by the propagation of the wave through the object and the interaction of the wave with the material structure of the object.

Some embodiments are based on another realization that the nonlinearity of the image acquisition can be modelled by representing the total field of wave propagation using the known incident field generated by the transmitter and the scattered field, scattered by the object in the unknown image. This realization allows representing a product of the phaseless measurements with the unknown phase as a nonlinear function of known incident field and unknown image of the scene.

To that end, some embodiments solve a multi-variable minimization problem over unknown phase of the phaseless measurements and unknown image of the permittivity of the material of the object 106,108 by minimizing a difference of a nonlinear function of the known incident field $u_{in}$ and the unknown image with a product of known magnitudes of the phaseless measurements and the unknown phase. Some embodiments further include regularization terms for the unknown image and the unknown phase.

Such a formulation is still nonlinear and non-convex. However, the nature of this formulation leads to a better-behaved non-convex objective function (a function of the unknown image and the unknown phase) due to decoupling the multiplicative relationship between the unknown image and the unknown phase, and therefore allows for various non-convex and even convex solvers to obtain high quality reconstructed images. For instance, if the total field u is known, the formulation (3) becomes linear because the formulation decouples the unknown phase p from the unknown image f. Hence, for example, some embodiments solve the phaseless image recovery problem by minimizing an objective function that includes the sum of a data fidelity term and a regularization term, where the data fidelity term includes the difference between a nonlinear function of the known incident field and the unknown image of the scene and a product of the phaseless measurements with the unknown phase, and the regularization term includes the sum of a total variation penalty of the unknown image and a magnitude constraint of the unknown phase (a valid phase variable has magnitude equal to one).

In various implementations, the embodiments use convex and/or non-convex solvers to minimize the objective function using an alternating minimization methods or simultaneous multi-variable minimization methods that solve the optimization over both unknowns simultaneously by updating both unknowns for each iteration. Examples of simultaneous multi-variable minimization methods include proximal gradient methods such as fast iterative shrinkage-thresholding algorithm (FISTA) and its variates. In particular, some embodiments use FISTA to minimize the aforementioned objective function and call the resulting algorithm phaseless iterative shrinkage-thresholding algorithm (PISTA). In accordance with the solution of the multi-variable minimization problem, an image of the permittivity of the material of the object 106,108 is rendered.

System Overview

Figure 2A:
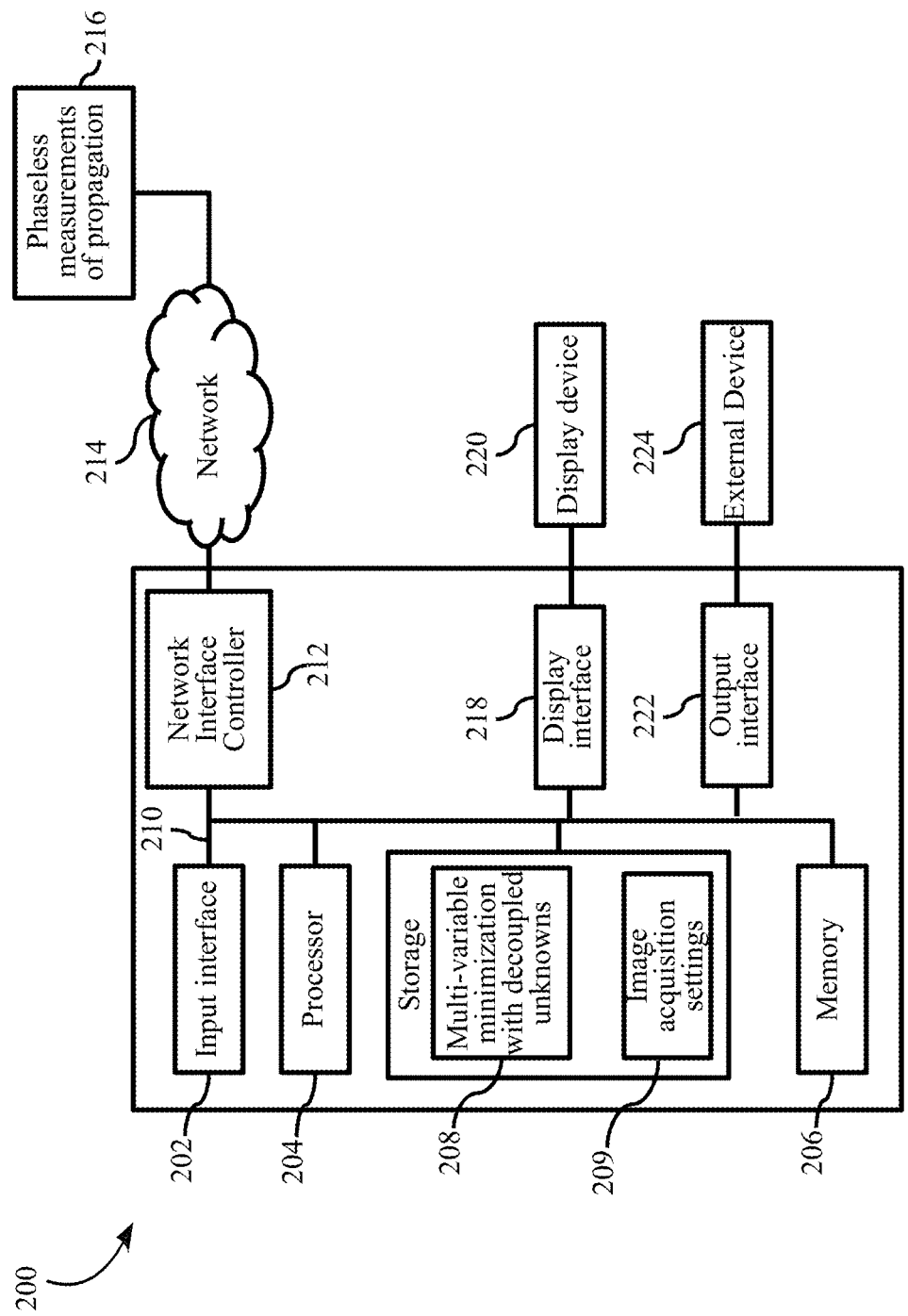
FIG. 2A shows a block diagram of a permittivity sensor for determining an image of a distribution of permittivity of a material of an object in a scene, according to some embodiments.

FIG. 2A shows a block diagram of a permittivity sensor 200 for determining an image of a distribution of permittivity of a material of the object 106, 108 in a scene, according to some embodiments. The permittivity sensor 200 includes an input interface 202 configured to accept phaseless measurements of propagation 216, from a device, e.g., from the sensor 112, for determining the image of the distribution of the permittivity of the material of the object 106,108.

Further, the permittivity sensor 200 includes a network interface controller (NIC) 212 adapted to connect the permittivity sensor 200 through a bus 210 to a network 214. Through the network 214, either wirelessly or through wires, the permittivity sensor 200 may receive the phaseless measurements of propagation 216. The system 200 stores image acquisition settings 209 used by multi-variable minimization 208 to reconstruct the image of the scene. The image acquisition settings can include settings used by a forward operator capturing specifics of the image acquisition, such as type and mutual arrangement of imaging equipment transmitting and receiving reflection of transmitted signals from one or more objects in the scene, type and frequency of the signals, optics of the imaging equipment, and position and motion of the imaging equipment.

The image acquisition settings 209 can define an input field $u_{in}$. Additionally or alternatively, the phaseless measurements of propagation 216 may include information of input field $u_{in}$ corresponding to the incident wave 102 and characteristics of the scattered wave 110 such as known parameters of the scattered wave 110 for example, the magnitude of the scattered wave 110, and the like.

The permittivity sensor 200 includes a memory 206 that stores instructions executable by a processor 204. The processor 204 may be a hardware processor configured to execute the stored instructions in order to control operations of the permittivity sensor 200. The processor 204 may be a single core processor, a multi-core processor, a graphics processing unit (GPU), a computing cluster, or any number of other configurations. The memory 206 may include random access memory (RAM), read only memory (ROM), flash memory, or any other suitable memory systems.

In some embodiments, the memory 206 may store programming instructions to execute multi-variable minimization with decoupled unknowns 208. The solution of the multi-variable minimization 208 performs non-convex phaseless image reconstruction by decoupling the unknown phase and the unknown image f. More specifically, based on the execution of such programming instructions, the processor 204 is configured to solve the multi-variable minimization problem over the unknown phase of the phaseless measurements 216 and the unknown image f of the permittivity of the material of the object 106,108 by minimizing a difference of the nonlinear function of the known incident field $u_{in}$ and the unknown image f with the product of known magnitudes of the phaseless measurements 216 and the unknown phases, possibly including regularization terms for the unknown image and the unknown phases.

In some embodiments, the processor 204 is configured to solve the multi-variable minimization problem 208 using a simultaneous multi-variable minimization over both unknowns simultaneously by updating the both unknowns for each iteration. Examples of simultaneous multi-variable minimization includes a multi-variable gradient descent that finds minimum of a function such that the optimization algorithm provides a solution of the inverse multiple scattering image reconstruction problem.

Accordingly, the memory can store a set of instructions for solving the multi-variable minimization problem 208. Examples of such instructions include proximal gradient methods such as Phaseless Iterative Shrinkage-Thresholding Algorithm (PISTA) and the like to simultaneously update the unknown object (i.e. an image of the object 106,108) and the unknown phase of the measurements (i.e. the scattered field 110) at each iteration. Alternatively, the memory 206 may store a set of program instructions corresponding to alternating minimization algorithm and other algorithms capable of solving non-convex optimization problems.

In some implementations, the permittivity sensor 200 is connected to an output interface 222 through the bus 210 adapted to connect the permittivity sensor 200 to an external device 224 configured to render the distribution of the permittivity of the material of the object 106,108 output by the permittivity sensor 200. In some other embodiments, the permittivity sensor 200 is communicatively coupled to a plurality of external devices.

Additionally, or alternatively, in one embodiment, the permittivity sensor 200 is connected to a display interface 218 through the bus 210 adapted to connect the permittivity sensor 200 to a display device 220. The display device 220 is configured to render the result of the image inversion that corresponds to an image of the distribution of the permittivity of the material of the object 106,108 output by the permittivity sensor 200.

Some embodiments are based on a realization that the object 106,108 is illuminated by the incident wave 102 transmitted from the one or more transmitters and further the incident wave 102 is scattered by the material of the object 106,108. The incident wave 102 is selected prior to illuminate the object 106,108 based on a combination of various frequencies. Accordingly, the incident wave 102 is a known parameter and the incident field $u_{in}$ is known.

Further, the processor 204 is configured to accept, via the input interface 202, the phaseless measurements of propagation 216 of the known incident field $u_{in}$ through a scene and scattered by the material of the object 106,108 present in the scene. The phaseless measurements of propagation 216 includes the information of the input field $u_{in}$ corresponding to the incident wave 102 and the characteristics of the scattered wave 110 such as the known parameters of the scattered wave, for example the magnitude of the scattered wave 110, and the like.

Based on the acceptance of the phaseless measurements of propagation 216, the processor 204 is further configured to retrieve the set of program instructions stored in the memory 206 in order to solve a multi-variable minimization problem over the unknown phase of the phaseless measurements 216 and unknown image f of the permittivity of the material of the object 106,108.

To that end, the processor 204 executes the retrieved set of program instructions to minimize an objective function that includes the difference of a nonlinear function of the known incident field $u_{in}$ and the unknown image f with a product of known magnitudes of the phaseless measurements 216 and the unknown phases, possibly including regularization terms of the unknown image and the unknown phases. More specifically, the processor 204 executes the set of programming instructions based on the phaseless measurements of propagation 216 in order to minimize the objective function such that the multi-variable minimization problem is solved.

In some embodiments, the set of program instructions corresponding to the alternating minimization is executed by the processor 204. Alternatively, the set of instructions corresponding to a multi-variable proximal gradient method is executed by the processor 204. The multi-variable proximal gradient method is implemented using execution of algorithms such as PISTA.

By the solution of the multi-variable minimization problem, the processor 204 is configured to determine distribution of permittivity of the material of the object 106,108. More specifically, the processor 204 determines an image of the distribution of the permittivity of the material of the object 106,108. Further, the permittivity of the material of the object 106,108 is rendered on the external device 224 via the output interface 222. Additionally, or alternatively, the permittivity of the material of the object 106,108 is rendered on the display device 218 via the display interface 220.

By solving the multi-variable minimization problem over the unknown phases of the phaseless measurements 216 and the unknown image f, the processor 204 optimizes the unknown parameters given the magnitude of the scattered field $u_{sc}$. Accordingly, the permittivity sensor 200 facilitates accurate determination of the image of the distribution of the permittivity of the material of the object 106,108 based on optimization of the unknown parameters given the magnitude of the scattered field $u_{sc}$.

Exemplar Solutions

Figure 2B:
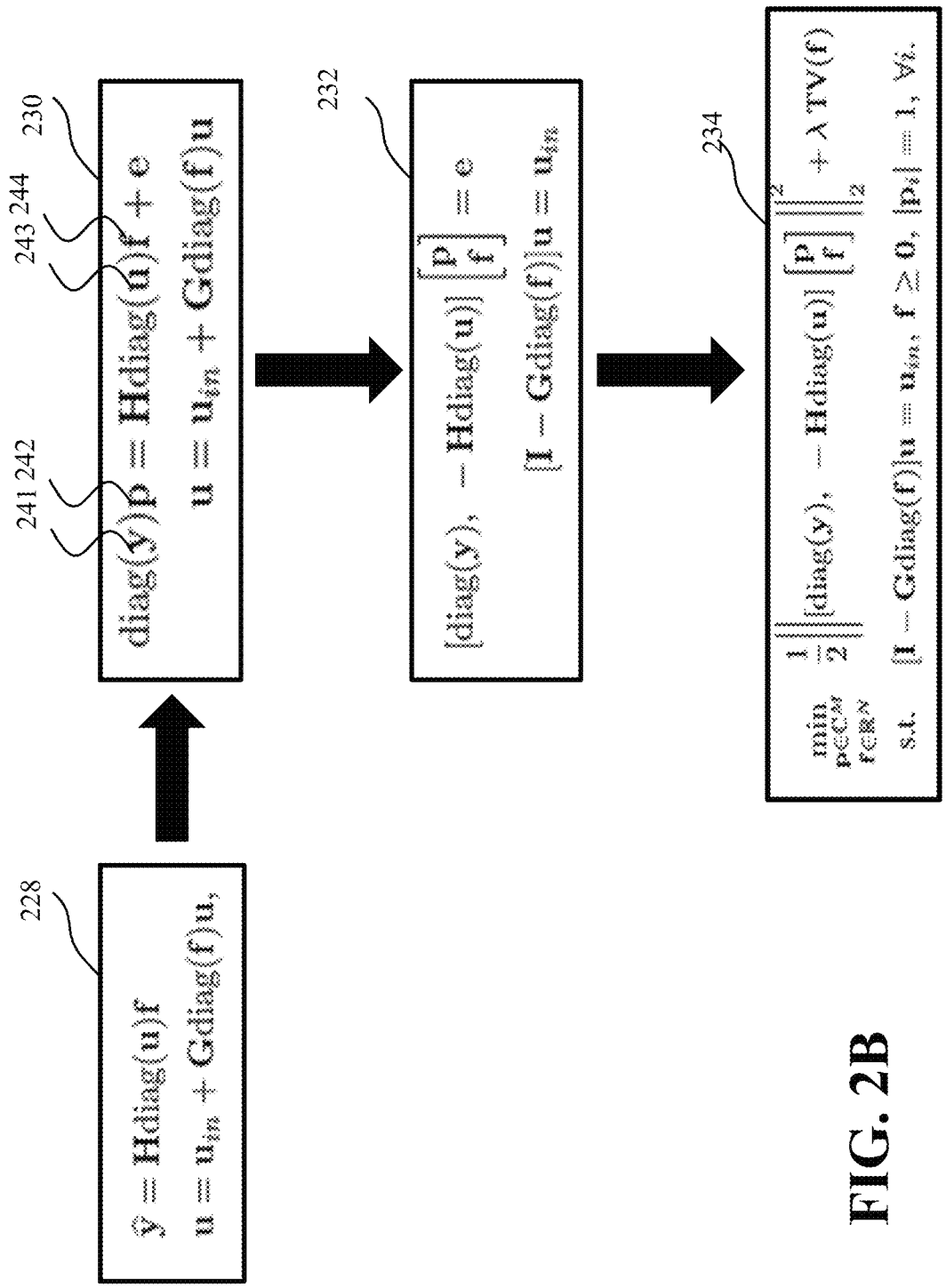
FIG. 2B shows a determination of optimization algorithm based on the phaseless measurements of propagation, according to some embodiments.

FIG. 2B shows determination of optimization algorithm based on the phaseless measurements of propagation 216, according to some embodiments.

It is an objective of some embodiments to decouple variables that represent the unknown image and the unknown phase in the forward model capturing image acquisition in order to optimize unknown parameters given the magnitude of the scattered field $u_{sc}$ such that the reconstruction problem over both the unknown image and the unknown phase is solved simultaneously and the multiplicative coupling between the unknown image and the unknown phase is removed.

Referring to FIG. 1, discretized system for the imaging setup 100 is formulated as the formulation (1) 228, which is further rearranged based on the phaseless measurement system as the formulation (2) in the absence of noise. Further, the formulation (2) is expressed as the formulation (3) in the presence of noise 230.

The formulation (3) removes the multiplicative coupling between the unknown phase and the unknown image f in the discretized system for the imaging setup 100. Hence, the formulation (3) defines a multi-variable minimization problem over unknown phases of the phaseless measurements and unknown image of the permittivity of the material of the object that minimizes a difference of a nonlinear function of the known incident field 243 and the unknown image 244 with a product of known magnitudes 242 of the phaseless measurements and the unknown phases 242;

By the rearrangement of the formulation (3), following expression 232 is obtained:

$$[\mathrm{diag}(y), -H\mathrm{diag}(u)]\begin{bmatrix} p \\ f \end{bmatrix} = e \quad (4)$$

$$[I - G\mathrm{diag}(f)]u = u_{in}, \quad (5)$$

where p and f in the formulation (4) lie in a null space of the matrix [diag(y), −H diag(u)] in the absence of noise, which may not be unique.

More specifically, p and the f in the formulation (4) in the null space includes the trivial all-zero solutions which leads to ambiguous results. This effect is called as the multi-variable minimization problem. Further, a constraint (5) on the total field u reduces the size of the solution space, and a set of constraints are introduced in order to further resolve such a problem.

To that end, some embodiments are based on a realization that object permittivity contrast f is typically smooth in spatial coordinates and the object permittivity contrast f is only associated with non-negative values. Additionally, p is a phase-only complex vector with unit entry-wise magnitudes such that $|p_i|=1$ for i=1, . . . , M. With these additional priors and constraints, some embodiments use total-variation(TV)-based regularization with a non-negativity constraint on the object permittivity contrast f and a unit-magnitude constraint on the phase-only vector p, thus the phaseless inverse scattering requires solving the following optimization 234

$$\min_{\substack{p \in \mathbb{C}^M \\ f \in \mathbb{R}^N}} \frac{1}{2}\left\|[\mathrm{diag}(y), -H\mathrm{diag}(u)]\begin{bmatrix} p \\ f \end{bmatrix}\right\|_2^2 + \lambda TV(f) \quad (6)$$

s.t. $[I - G\mathrm{diag}(f)]u = u_{in}, f \geq 0, |p_i| = 1, \forall i.$ where, $$TV(f) = \sum_{n=1}^{N} \sqrt{|D_1 f|^2 + |D_2 f|^2}$$

represents TV regularization,
$D_i$ represents the discrete difference operator in the i-th spatial dimension, and
$\lambda$ is the optimization parameter.

Writing u as a function f according to (5) and plugging it into the first term of (6), the first term of (6) is a differentiable function of f and the gradient can be efficiently computed via a conjugate gradient method. Accordingly, the processor 204 may be configured to solve the multi-variable minimization problem using a proximal gradient method to perform simultaneous multi-variable minimization over both unknowns simultaneously by updating the both unknowns for each iteration. The gradient of the f and p is estimated recursively for a fixed number of iterations or until a termination condition is met. The termination condition may be based on simultaneous estimation of the gradient of the f and p until a unique value of the gradient is achieved.

To that end, the formulation (6) may be solved by use of a method (hereinafter "Algorithm 1") based on known phaseless measurements such as known incident field $u_{in}$, known magnitude of the phaseless measurements 216. Such an algorithm is called as PISTA, which uses FISTA as the solver for the optimization problem (6). In some embodiments, the formulation (6) is solved based on FISTA. In some alternative embodiments, the formulation (6) is solved based on other algorithms that can solve non-convex and non-smooth optimization problems.

To that end, the processor 204 may be configured to execute the set of instructions corresponding to the PISTA algorithm to simultaneously recover the unknown object and the phase of the measurements from the nonlinear and nonconvex inverse scattering problem.

Algorithm 1: PISTA

---

Algorithm 1: PISTA - Phaseless Iterative Shrinkage-Thresholding Algorithm

Data: y, H, G, $\alpha$, $\lambda$
$q_1 = f_0 = 0$; $s_1 = p_0 = 1$;
while stopping criteria do $k = k + 1;$
$f_k = \mathcal{P}_{TV,\lambda,(\cdot)\geq 0}(q_k - \alpha \nabla_f (q_k, s_k));$
$p_k = \mathcal{P}_{|\cdot|=1}(s_k - \alpha \nabla_p (q_k, s_k));$
$t_{k+1} = \dfrac{1 + \sqrt{1 + 4t_k^2}}{2};$
$q_{k+1} = f_k + \dfrac{t_k - 1}{t_{k+1}}(f_k - f_{k-1});$
$s_{k+1} = p_k + \dfrac{t_k - 1}{t_{k+1}}(p_k - p_{k-1});$ end
Result: $\hat{p}$, $\hat{f}$

---

In the Algorithm 1,
$\alpha$ represents a step size,
$P_{TV, \lambda, |\cdot|\geq 0}$ represents the proximal mapping for TV regularization with non-negativity constraints,
$P_{|\cdot|=1}$ represents the nonconvex proximal mapping on to the surface of the M-dimensional complex sphere, obtained by scaling each complex entry of a vector to be unit magnitude, and
$\nabla f(f,p)$ and $\nabla p(f,p)$ represents the components associated with f and p, respectively, of the gradient $\nabla(f,p)$ of the smooth data fidelity term.

More specifically, some embodiments are based on a realisation of an overall gradient of the data fidelity term in the formulation (6) as described in following proposition:

Proposition:

In some embodiments, the p and f components of the gradient of the data fidelity term in the formulation (6) may, respectively, be expressed as:

$$\nabla_p(f,p) = -\text{diag}(y)^H r, \quad (7)$$

and $$\nabla_f(f,p) = \text{diag}(u)^H (H^H r + G^H w), \quad (8)$$

where,
r=[H diag(u)f−diag(y)p] is the residual vector,
A=I−G diag(f), and
u and w correspond to solutions of the following linear systems:

$$Au = u_{in}, A^H w = \text{diag}(f) H^H r, \quad (9)$$

linearized around the current estimate of the f.

Proof. The gradient of the data term with respect to p, $\nabla p(f,p)$, may be determined based on matrix derivatives.

Further, with reference to the formulation (6), the derivative with respect to f, $\nabla f(f,p)$, can be expressed as:

$$\nabla_f \left[ \frac{1}{2} \left\| [\text{diag}(y), -H\text{diag}(u)] \begin{bmatrix} p \\ f \end{bmatrix} \right\|_2^2 \right] = J_f^H r, \quad (10)$$

where $J_f$ represents the Jacobian with respect to f, which can be further expressed as:

$$J_f = \frac{d}{df}(H\text{diag}(u)f). \quad (11)$$

Further, the derivative in the formulation (11) is solved using differentials as:

$d(H \text{ diag}(u)f) = H \text{ diag}(u)df + Hd(\text{diag}(u)f$ $$= H \text{ diag}(u)df + H \text{ diag}(f)du, \quad (12)$$

where some embodiments are based on a realization that u is a function of f and that when taking the differential with respect to only the total field u following relationship is established:

$d(\text{diag}(u))f = d(\text{diag}(u)f) = d(\text{diag}(f)u) = \text{diag}(f)du.$ Moreover, with $u = A^{-1} u_{in}$, differential of u is expressed as:

$$du = -A^{-1}dAA^{-1}u_{in} = -A^{-1}dAu. \quad (13)$$

Further, differential of A is expressed as:

$$dA = d(I-G \text{ diag}(f)) = -Gd(\text{diag}(f)), \quad (14)$$

which can be used to arrive at $dAu = -Gd(\text{diag}(f))u = -G \text{ diag}(u)df$.

By use of all of the differentials, the Jacobian is expressed as:

$$J_f = H \text{ diag}(u) + H \text{ diag}(f) A^{-1} G \text{ diag}(u). \quad (15)$$

Finally, combining (15) and (10), (8) is obtained.

Further, based on the expressions (7) and (8) for the gradient, the processor 204 is configured to compute the required gradient which is used to determine distribution of permittivity of material of the object 106,108.

In accordance with the execution of the PISTA algorithm, the processor 204 solves the multi-variable minimization problem over the unknown phases of the phaseless measurements 216 and the unknown image x of the permittivity of the material of the object 106,108.

Accordingly, the processor 204 determines the distribution of the permittivity of the material of the object 106,108 with high resolution and accuracy based on the solution of the multi-variable minimization problem. Further, the processor 204 renders the determined permittivity of the material of the object 106,108 via the output interface 222.

Figure 3:
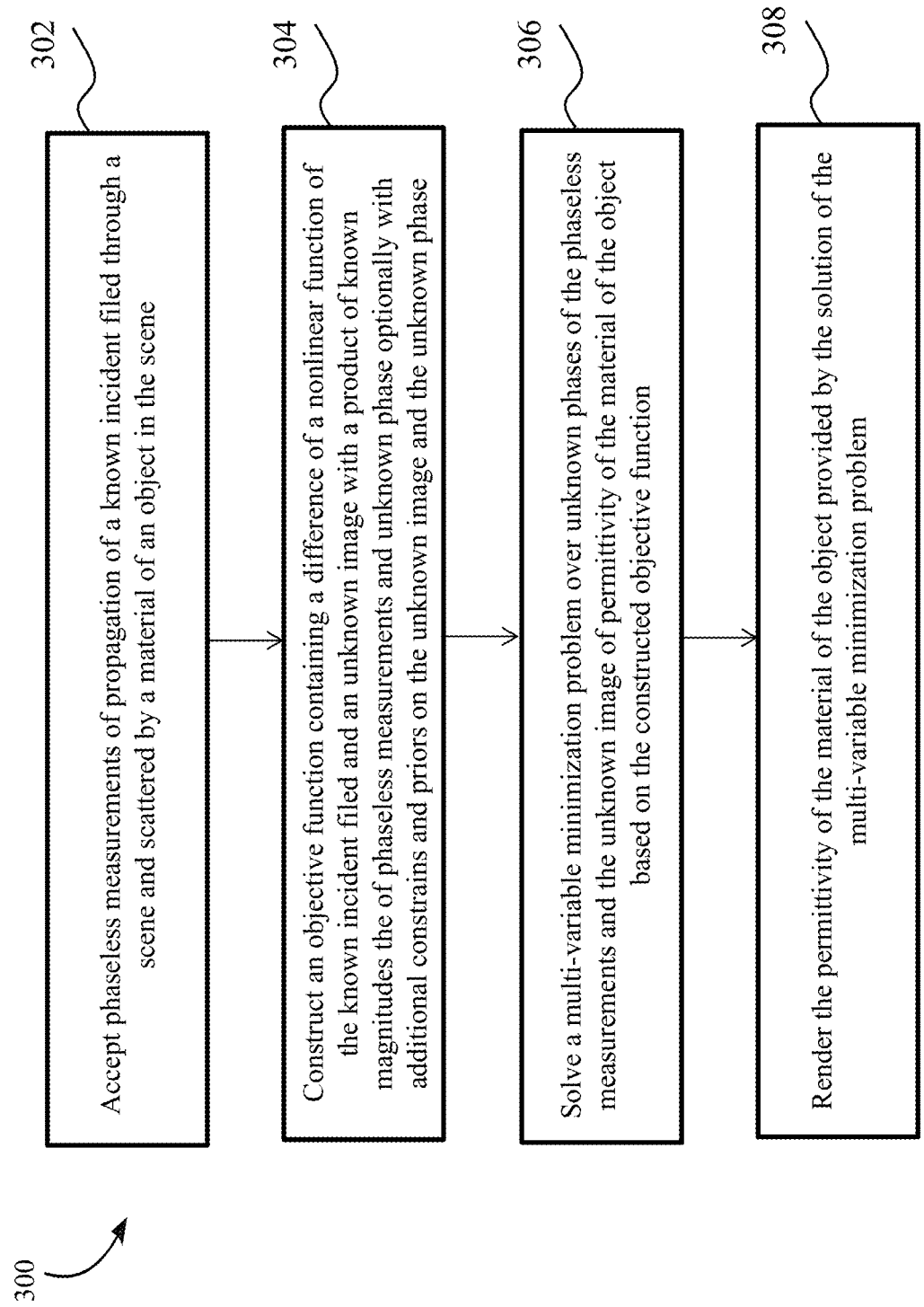
FIG. 3 shows a schematic for workflow of determining the image of the distribution of permittivity of the material of the object in the scene, according to some embodiments.

FIG. 3 shows a schematic for workflow of determining the image of the distribution of permittivity of the material of the object 106,108 in the scene, according to some embodiments.

The workflow is executed by the processor 204 based on the phaseless measurements of propagation 216.

The set of instructions, phaseless measurements of propagation 216 of the known incident field $u_{in}$ through the scene and scattered by the material of the object 106,108 in the scene, are applied 302. Further, the processor 204 executes the set of instructions based on the phaseless measurements of the propagation 216 in order to minimize the difference of a nonlinear function of the known incident field $u_{in}$ and the unknown image x with the product of known magnitudes of the phaseless measurements of the propagation 216 and the unknown phases 304, optionally with additional constraints and priors on the unknown image and the unknown phases (as described in (6)).

Further, the processor 204 executes the set of program instructions in order to solve the multi-variable minimization problem over the unknown phases of the phaseless measurements of the propagation 216 and unknown image f of the permittivity of the material of the object 106,108 306 (as described in description of FIG. 2B). By the solution of the multi-variable minimization problem, the processor 204 renders the permittivity of the material of the object 106,108 via the output interface 222 or the display interface 218 308. Accordingly, a highly accurate image of the material of the object 106,108 is obtained.

Figure 4A:
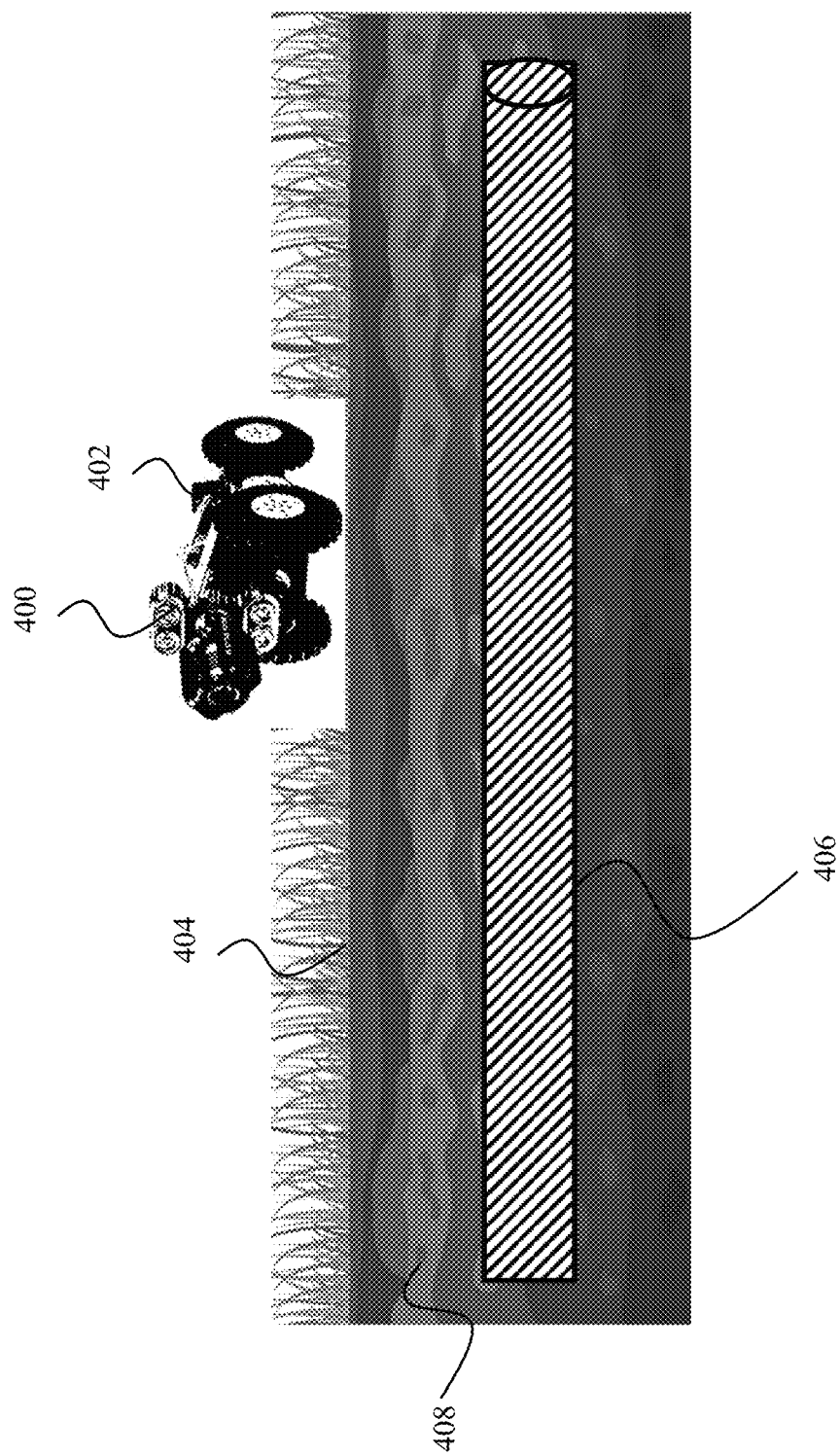
FIG. 4A shows a schematic of a civil infrastructure system to generate a map of non-visible objects in a civil infrastructure, according to some embodiments.

FIG. 4A shows a schematic of a civil infrastructure system to generate a map of non-visible objects in a civil infrastructure, according to some embodiments.

In FIG. 4A, there is shown a civil infrastructure system 400 in a civil infrastructure 404, where the civil infrastructure system 400 comprises at least a permittivity sensor 402, one or more transmitters configured to transmit one or more electromagnetic signals, and one or more receivers configured to receive one or more scattered waves. The permittivity sensor 402 corresponds to the permittivity sensor 200 as described in FIG. 2A. In FIG. 4A, there is further shown an underground pipe 406 in mud 408 located underground of the civil infrastructure 404, where the underground pipe 406 and particles of the mud 406 (such as rocks, soil, water, and the like) may correspond to non-visible objects of the civil infrastructure 404. Alternatively, the civil infrastructure 404 may include a plurality of pipes located underground as non-visible objects.

In some embodiments, the civil infrastructure system 400 is a moving platform traveling on ground of the civil infrastructure 404. The civil infrastructure system 400 incidents the electromagnetic signals (such as the known incident field $u_{in}$) on the ground of the civil infrastructure 404. When the electromagnetic signals propagate through the ground, the electromagnetic signals are reflected from the non-visible objects (i.e. underground pipe 406 and the particles of the mud 408).

Based on the reflections (i.e. the one or more scattered waves), the civil infrastructure system 400 detects presence of the non-visible objects located underground of the civil infrastructure 404.

To that end, the permittivity sensor 402 arranged on the moving platform accepts the reflected electromagnetic signals from the underground pipe 406 and from the particles of the mud 408. The permittivity sensor 402 further accepts phaseless measurements of the propagated electromagnetic signals with unknown phase (such as the phaseless measurements of propagation 218).

Further, the permittivity sensor 402 solves a multi-variable minimization problem over unknown phases of the phaseless measurements and unknown image of the permittivity of a material of the underground pipe 406 and the particles of the mud 408, by minimizing a difference of a nonlinear function of the known incident field and the unknown image with a product of known magnitudes of the phaseless measurements and the unknown phases possibly including additional constraints on the unknown image and the unknown phases as described in description of FIG. 2A and FIG. 2B.

Based on the solution of the multi-variable minimization problem, the permittivity sensor 402 determines distribution of permittivity of the material of the underground pipe 406 and the particles of the mud 408. The permittivity sensor 402 further generates a map 408 of the underground pipe 406 and the particles of the mud 408 based on the permittivity of the underground pipe 406 and renders the map 408 via an output interface (e.g., the output interface 222). An output of the map 408 of the underground pipe 406 and the particles of mud is illustrated in FIG. 4B, where the distribution of the permittivity of the material of the non-visible objects (i.e. the underground pipe 406 and the particles of mud 408) is shown.

Figure 4B:
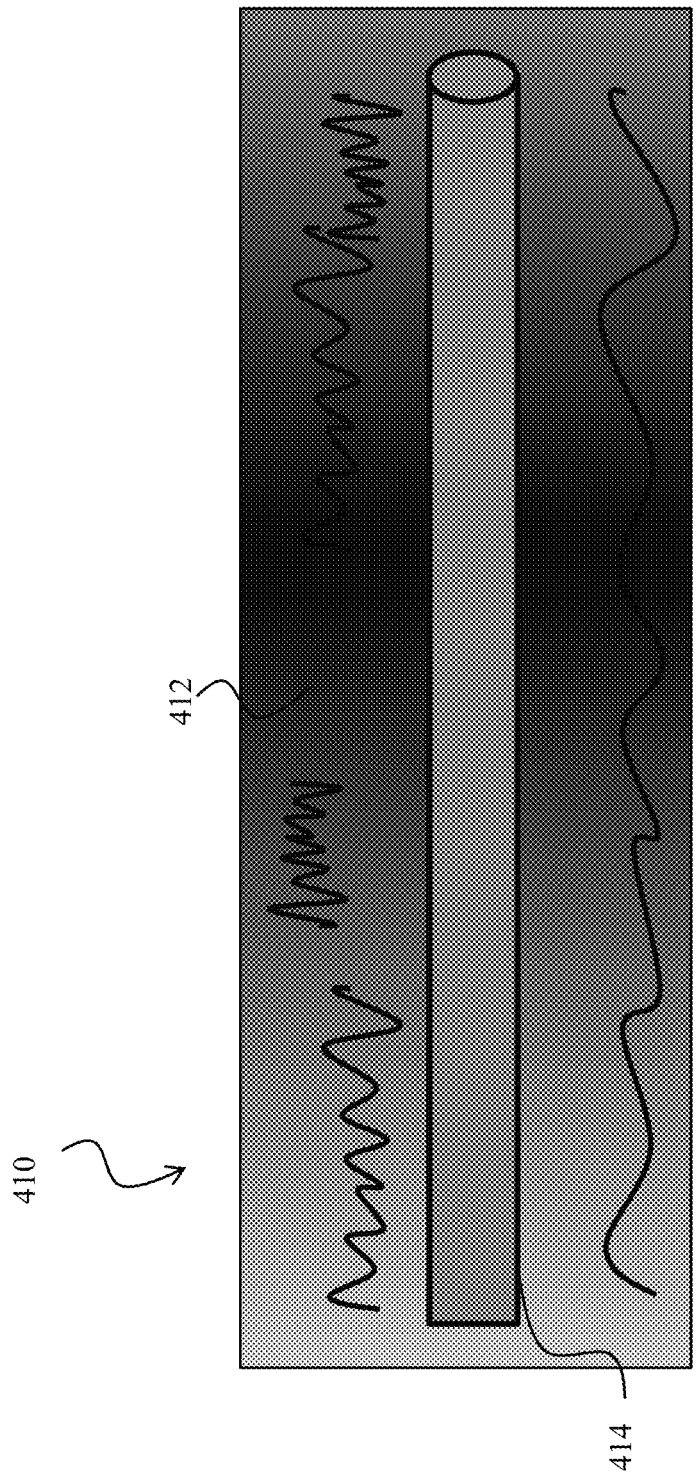
FIG. 4B shows an exemplary output of the map of the non-visible objects, according to some embodiments.

FIG. 4B shows an exemplary output of the map of the non-visible objects, according to some embodiments. In FIG. 4B, shows is a map 410 that corresponds to the distribution of the permittivity of the material of the underground pipe 406 and the particles of the mud 408. The map 410 includes an image 412 that corresponds to the particles of the mud 408 and an image 414 that corresponds to the underground pipe 406. Accordingly, based on the phaseless measurements by means of the permittivity sensor 402 of the civil infrastructure system 400, the non-visible objects in the civil infrastructure 404 are detected.

Figure 4C:
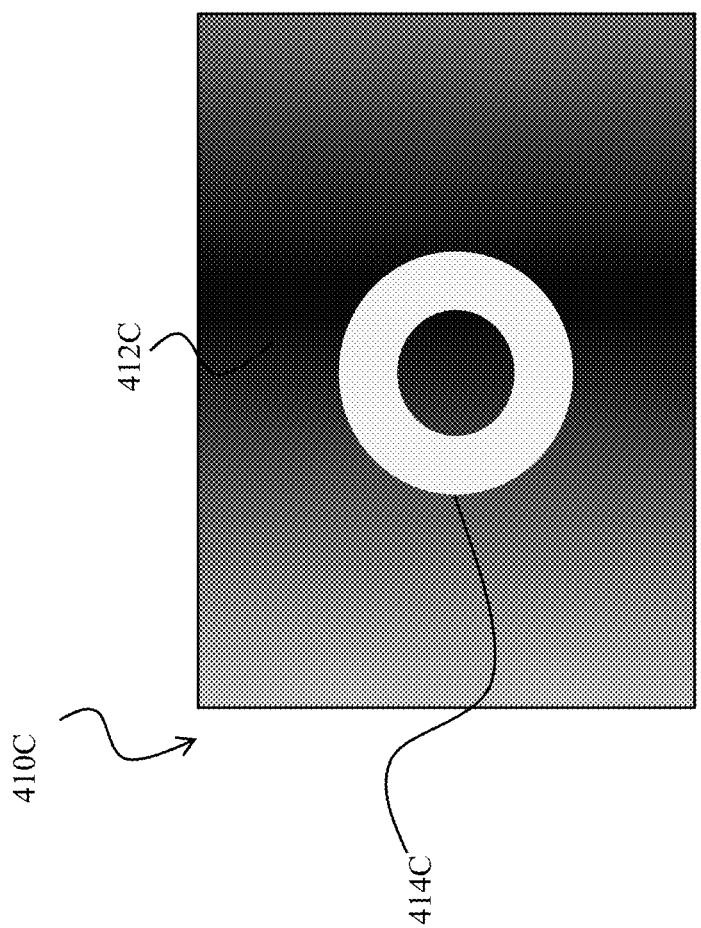
FIG. 4C shows an alternative exemplary output of the map of the non-visible objects, according to some embodiments.

FIG. 4C shows an alternative exemplary output of the map of the non-visible objects, according to some embodiments. In FIG. 4C, shows a 2-dimensional map 410 that corresponds to the distribution of the permittivity of the material of the underground pipe 406 and the particles of the mud 408 for a cross-section of the pipe. The map 410 includes an image 412 that corresponds to the particles of the mud 408 and an image 414 that corresponds to the underground pipe 406. Accordingly, based on the phaseless measurements by means of the permittivity sensor 402 of the civil infrastructure system 400, the non-visible objects in the civil infrastructure 404 are detected.

Figure 5A:
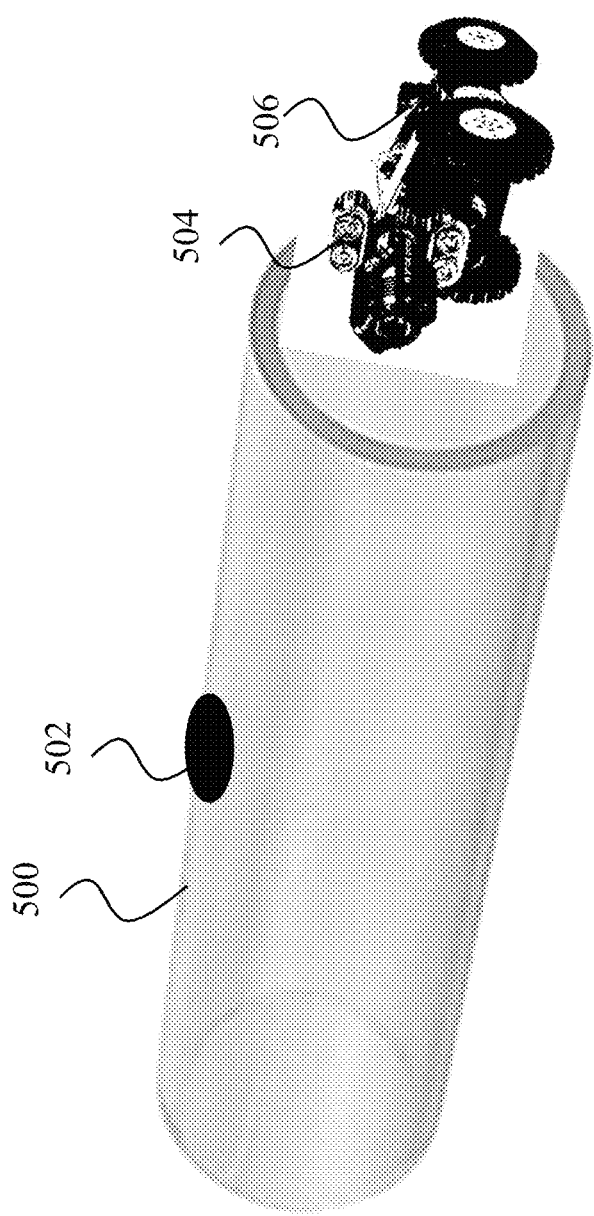
FIG. 5A shows a schematic of a civil infrastructure system to generate a map of cavities of non-visible objects in a civil infrastructure, according to some embodiments.

FIG. 5A shows a schematic of a civil infrastructure system to generate a map of cavities in non-visible objects in a civil infrastructure, according to some embodiments.

In FIG. 5A, there is shown a civil infrastructure that comprises objects such as pipes (for example, a pipe 500). The pipe 500 includes a set of cavities (such as a cavity 502). In some embodiments, the cavity 502 may be a defect in the pipe 500. There is further shown a civil infrastructure system 504 that comprises at least a permittivity sensor 506, one or more transmitters configured to transmit one or more electromagnetic signals, and one or more receivers configured to receive one or more scattered electromagnetic waves. The permittivity sensor 506 corresponds to the permittivity sensor 200 as described in FIG. 2A and the permittivity sensor 402 as described in FIG. 4A.

As shown in FIG. 5A, the civil infrastructure system 504 is a moving platform traveling inside the pipes (i.e. the pipe 500). As the civil infrastructure system 504 moves inside the pipe 500, the civil infrastructure system 504 incidents the electromagnetic signals (such as the known incident field $u_{in}$) on an inside structure of the pipe 500 via the one or more transmitters.

When the electromagnetic signals propagate inside the pipe 500, the electromagnetic signals are reflected from the inside structure of the pipe 500 and are received by the civil infrastructure system 504 via the one or more receivers. However, a portion of the pipe 500 where the cavity 502 is formed does not reflect back the electromagnetic wave as the incident electromagnetic wave propagates through the cavity 502 and further enters into a space outside the pipe 500.

Accordingly, the civil infrastructure system 504 does not receive the electromagnetic waves from the cavity 502.

Based on the reflections of the electromagnetic waves from the pipe 500, the civil infrastructure system 504 generates a map 508 of permittivity distribution of the inside structure of the pipe 500 by means of the permittivity sensor 506 (as described in description of FIG. 2B and FIG. 4A). Such a map is also called as a map of the cavities of the pipes. An output of the map of the cavities (i.e. the map 508) is shown in FIG. 5B, where the distribution of the permittivity of the inside structure of the pipe 500 is shown.

Figure 5B:
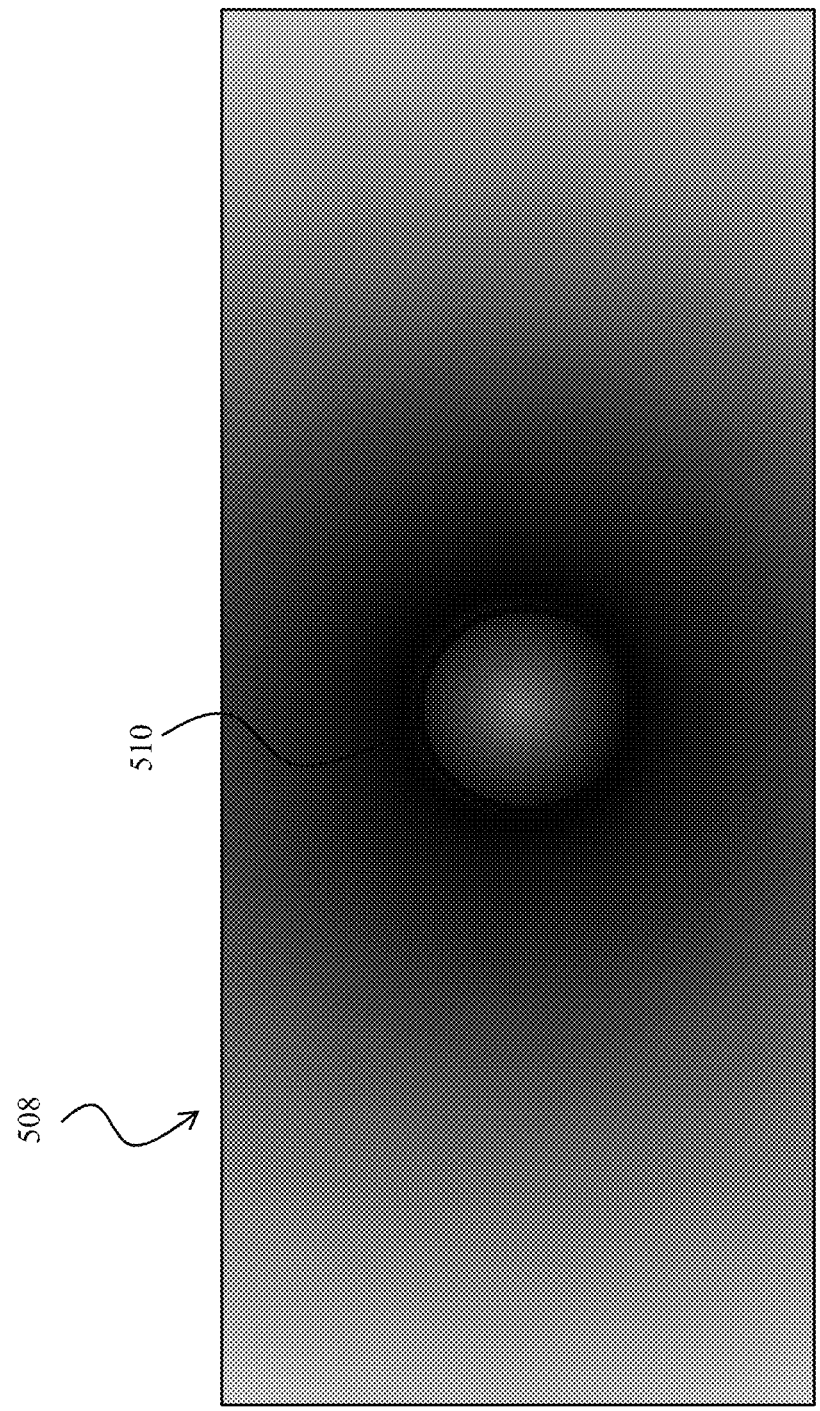
FIG. 5B shows an exemplary output of the map of the cavities of the non-visible objects in the civil infrastructure, according to some embodiments.

FIG. 5B shows, an exemplary output of the map of cavities of the non-visible objects in the civil infrastructure, according to some embodiments. In FIG. 5B, there is shown a map 508, where a part 510 of the map 508 represents the cavity 502. Accordingly, the civil infrastructure system 504 detects the defects in the objects of the civil infrastructure by use of the permittivity sensor 506.

Figure 6:
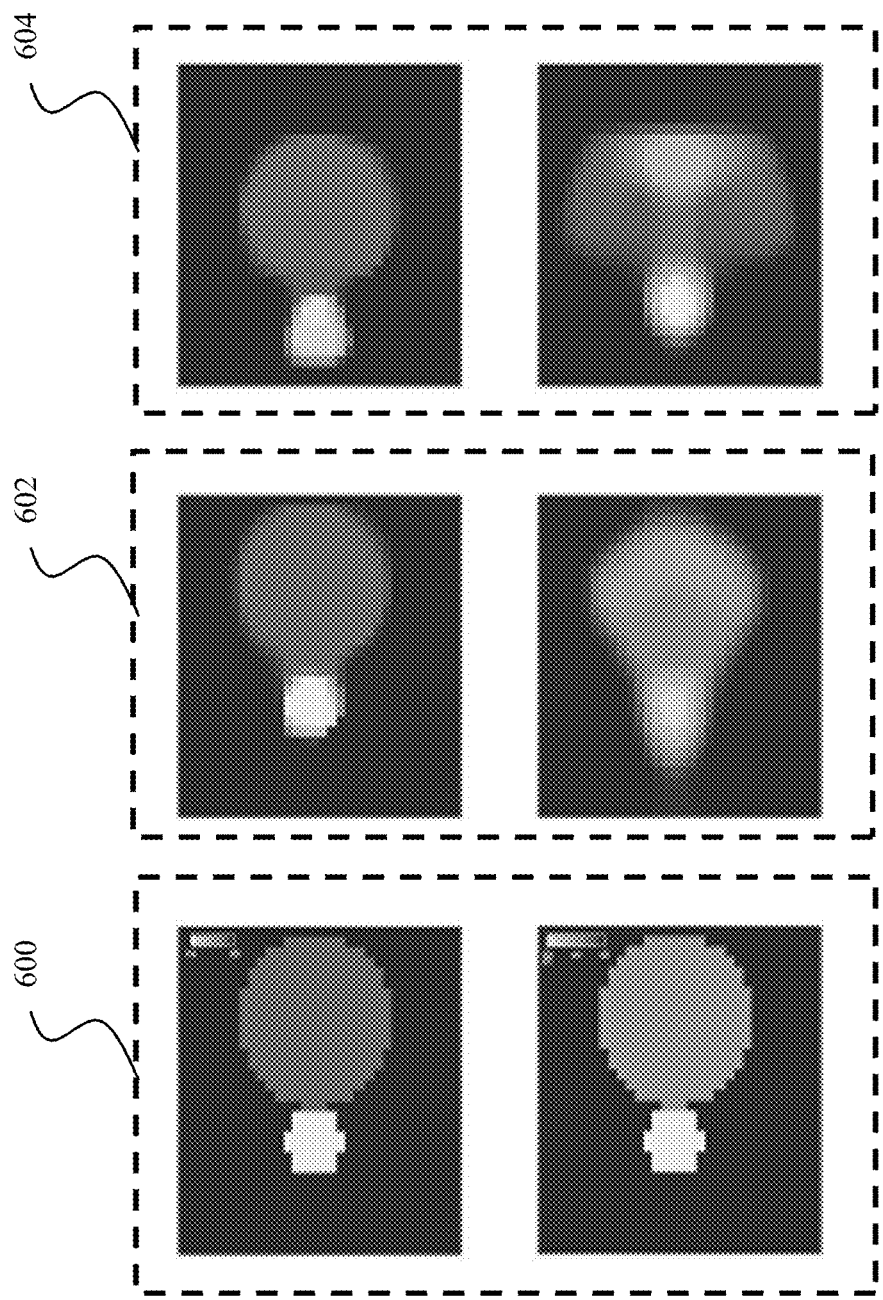
FIG. 6 shows a schematic of comparison of experiment results for permittivity distribution of a material of an object using the PISTA algorithm and state of art algorithms with high contrast settings, according to some embodiments.

FIG. 6 shows a schematic of comparison of experiment results for permittivity distribution of a material of an object using the PISTA algorithm and state of art algorithms with high contrast settings, according to some embodiments.

For instance, an object has a physical size of 15 cm*15 cm with two cylinders of permittivity contrast values 2 and 0.45, respectively, which is illuminated with one or more light signals containing multiple wavelengths (e.g., multiple wavelengths of 6 cm, 7.5 cm, 10 cm, 15 cm, and 30 cm) via a number of transmitters. Further, one or more scattered light signals are received from the object in order to obtain the experiment results.

To that end, the pixel size is set to 0.4688 cm and the number of transmitters is set to 24 with 36 receivers measuring the scattered light signal received from the object. The transmitters and receivers are uniformly placed in a circle of radius 1.67 m around the object. Further, the one or more scattered light signals are processed based on the state of art algorithm (e.g., alternating direction method of multipliers (ADMM)) and the PISTA algorithm, and accordingly the experiment results are obtained. More specifically, phaseless measurements of propagation of the one or more light signals are obtained by a processor (e.g., the processor 204), where the propagation measurements comprise information of at least the one or more scattered light signals, the one or more light signals incident on the object, or a magnitude of the one or more light signals. Further, the processor executes the set of program instructions to solve the nonlinear image inversion problem based on the propagation measurements as described in description of FIG. 2A and FIG. 2B.

Accordingly, an image of the object is reconstructed as the output map 602 and as the output map 604 based on the solution of the nonlinear image inversion problem using the ADMM algorithm and the PISTA algorithm at different contrast settings respectively.

In FIG. 6, there is shown a set of experiment results in a top row and in a bottom row with high contrast settings, where the high contrast settings are based on setting of a maximum permittivity contrast. More specifically, the top row contains experiment results for the object having maximum permittivity contrast 2 and the image is reconstructed using phaseless measurements of the scattered wave at multiple wavelengths. The bottom row contains experiment results for the object having maximum permittivity contrast 10 while using phaseless measurements of the scattered wave at only one wavelength (i.e., a wavelength of 30 cm).

There is further shown a simulated image 600 of the object in the top row and in the bottom row. Further, there is shown an output map 602 in the top row and in the bottom row, where the output map 602 is an experiment result generated based on the PISTA algorithm. Further, there is shown an output map 604 in the top row and in the bottom row, where the output map 604 is an experiment result generated based on the state of art algorithm ADMM.

Further, as shown in FIG. 6, reconstruction performance of both approaches (i.e. the ADMM algorithm and the PISTA algorithm) is reasonable for moderate contrast, however the PISTA algorithm visibly outperforms the ADMM algorithm for high contrast settings with only one frequency.

Figure 7:
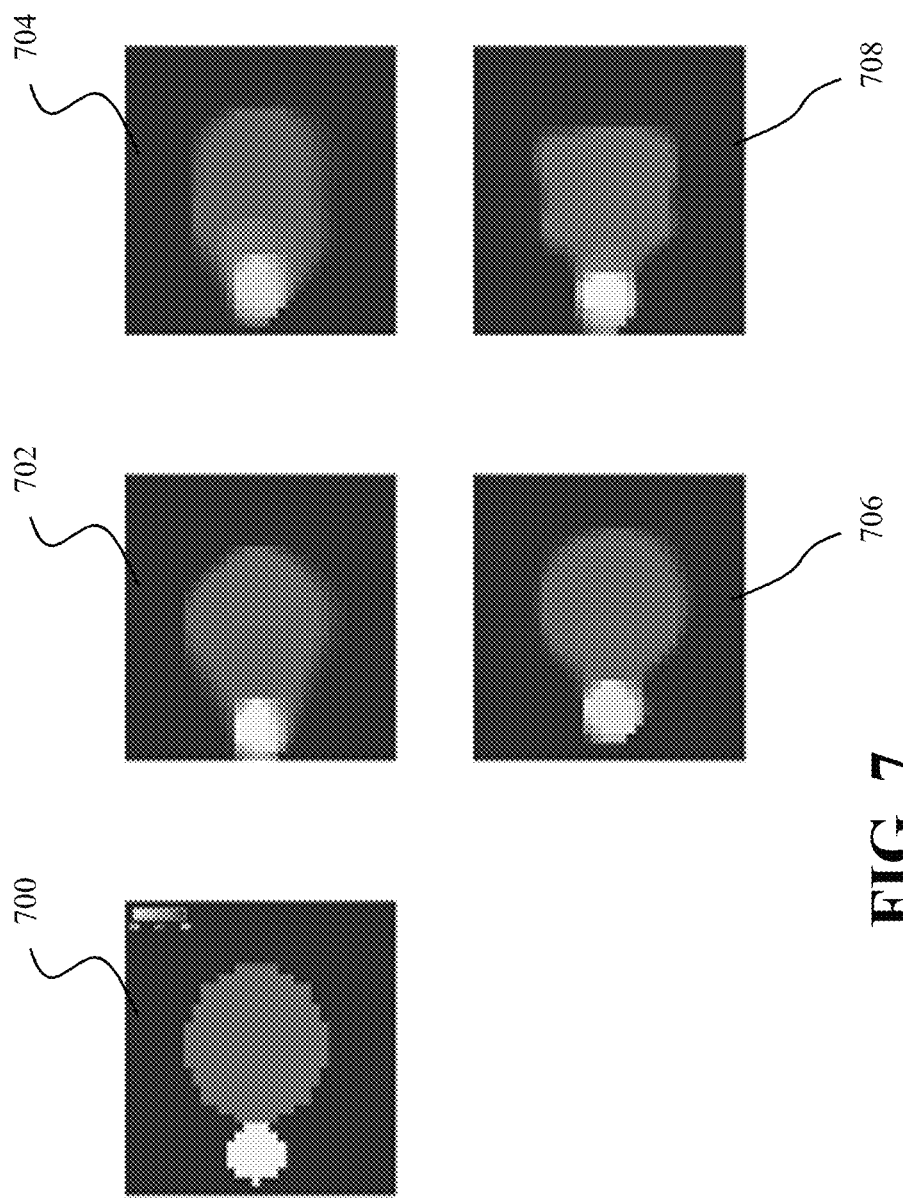
FIG. 7 shows a schematic of comparison of experiment results for permittivity distribution of a material of an object using the PISTA algorithm and state of art algorithms at different frequencies, according to some embodiments

FIG. 7 shows a schematic of comparison of experiment results for permittivity distribution of a material of an object using the PISTA algorithm and state of art algorithms at different frequencies, according to some embodiments.

In FIG. 7, there is shown experimental measurements for an object FoamDielExt™ from a Fresnel Institute public dataset. For instance, a region of 15 cm×15 cm is considered around an origin where the object FoamDielExt™ is placed. Further, eight transmitters and 360 receivers are placed uniformly in a circle of radius 1.67 m around the origin. The transmitters are turned on one at a time and data from only 241 receivers is used. The remaining 119 receivers closest to the transmitter are kept inactive.

Further, in FIG. 7, there is shown the object FoamDielExt™ as a ground truth 700 and reconstructed images (i.e. images 702-708) of the object (i.e. permittivity distribution map) based on the PISTA algorithm and the ADMM algorithm, in a top row and in a bottom row. The images 702 and 706 are based on the PISTA algorithm and the images 704 and 708 are based on the ADMM algorithm. Further, the images 702 and 704 (in the top row) are reconstructed for a single frequency of wavelength 10 cm, and images 704 and 706 (in the bottom row) are reconstructed for multiple frequencies of wavelengths 5 cm, 6 cm, 7.5 cm, 10 cm, and 15 cm at a pixel size of 0.4688 cm, where reconstruction of the images 702-708 of the object is same as described in description of FIG. 2B, and FIG. 6.

Further, from FIG. 7, it is clear that in some situation, the PISTA results in better reconstructions than the ADMM.

The above description provides exemplary embodiments only, and is not intended to limit the scope, applicability, or configuration of the disclosure. Rather, the above description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the above description to provide a thorough understanding of the embodiments. However, if understood by one of ordinary skill in the art the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations may be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

We claim:

1. A permittivity sensor for determining an image of a distribution of permittivity of a material of an object in a scene, comprising:
a transmitter configured to propagate a known incident field through the scene;
a receiver configured to accept phaseless measurements of propagation of the known incident field scattered by the material of the object in the scene;
a hardware processor configured to solve a multi-variable minimization problem over unknown phases of the phaseless measurements and unknown image of the permittivity of the material of the object by minimizing a difference of a nonlinear function of the known incident field and the unknown image with a product of known magnitudes of the phaseless measurements and the unknown phases, estimate the permittivity of the material of the object based on the solution of the multi-variable minimization problem, and generate the image of the distribution of permittivity of the material of the object in the scene based on the estimated permittivity; and
a display device configured to render the image of the distribution of permittivity of the material of the object in the scene.

2. The permittivity sensor of claim 1, wherein the processor is configured to solve the multi-variable minimization problem using a simultaneous multi-variable minimization over both unknowns simultaneously by updating the both unknowns for each iteration.

3. The permittivity sensor of claim 2, wherein the simultaneous multi-variable minimization uses a multi-variable proximal gradient method.

4. The permittivity sensor of claim 1, wherein the multi-variable minimization problem further includes additional constraints on the unknown image and the unknown phases.

5. The permittivity sensor of claim 4, wherein the multi-variable proximal gradient method is implemented using fast iterative shrinkage-thresholding algorithm (FISTA).

6. The permittivity sensor of claim 1, wherein the processor is configured to solve the multi-variable minimization problem using an alternating minimization.

7. The permittivity sensor of claim 1, wherein the output interface renders the permittivity of the material of the object to a civil infrastructure system configured to detect at least one of defects of the material of the object, cavities or non-visible objects of the civil infrastructure.

8. The permittivity sensor of claim 7, wherein the civil infrastructure system is configured to detect the non-visible objects including pipes located underground, and wherein the permittivity sensor is arranged on a moving platform traveling on the ground above the underground pipes, and wherein the civil infrastructure system is configured to generate a map of the underground pipes.

9. The permittivity sensor of claim 7, wherein the civil infrastructure system is configured to detect the cavities of objects of the civil infrastructure including pipes, and wherein the permittivity sensor is arranged on a moving platform traveling through the pipes, and wherein the civil infrastructure system is configured to generate a map of the cavities of the pipes.

10. The permittivity sensor of claim 1, wherein the permittivity of the material of the object corresponds to at least one of an internal structure of the object or an outer structure of the object.

11. A robot including the permittivity sensor of claim 1, the robot comprising:
a motor and wheels for moving the permittivity sensor to the scene.

12. A method for determining an image of a distribution of permittivity of a material of an object in a scene, wherein the method uses a processor coupled with stored instructions implementing the method, wherein the instructions, when executed by the processor carry out steps of the method, comprising:
propagating, using a transmitter, a known incident field through the scene;
accepting, using a receiver, phaseless measurements of propagation of the known incident field scattered by the material of the object in the scene;
solving a multi-variable minimization problem over unknown phases of the phaseless measurements and unknown image of the permittivity of the material of the object by minimizing a difference of a nonlinear function of the known incident field and the unknown image with a product of known magnitudes of the phaseless measurements and the unknown phases;

estimating the permittivity of the material of the object based on the solution of the multi-variable minimization problem;

generating the image of the distribution of permittivity of the material of the object in the scene based on the estimated permittivity; and rendering the image of the distribution of permittivity of the material of the object on a display device.

13. The method of claim 12, wherein the multivariable minimization problem further includes additional constraints on the unknown image and the unknown phases.

* * * * *